(12) United States Patent
Mochida

(10) Patent No.: US 6,311,080 B1
(45) Date of Patent: Oct. 30, 2001

(54) METHOD FOR DETECTING FULL CHARGE STATE OF BATTERY

(75) Inventor: Muneaki Mochida, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/236,625

(22) Filed: Jan. 26, 1999

(30) Foreign Application Priority Data

Jan. 29, 1998 (JP) .................................................. 10-016554

(51) Int. Cl.$^7$ ............................ H04B 1/38; G01N 27/416
(52) U.S. Cl. ............................ 455/573; 324/427; 324/433
(58) Field of Search .................................... 455/573, 572, 455/574, 343; 320/137; 324/427, 433, 428

(56) References Cited

U.S. PATENT DOCUMENTS

| | | | |
|---|---|---|---|
| 4,992,720 | * 2/1991 | Hata | 320/23 |
| 5,043,651 | * 8/1991 | Tamura | 320/43 |
| 5,157,320 | * 10/1992 | Kuriloff | 320/39 |
| 5,508,600 | * 4/1996 | Myslinski et al. | 320/48 |
| 5,598,086 | * 1/1997 | Somerville | 320/30 |
| 5,677,944 | * 10/1997 | Yamamoto et al. | 455/38.3 |
| 5,686,816 | * 11/1997 | Hayashi et al. | 320/106 |
| 5,691,621 | * 11/1997 | Phuoc et al. | 320/134 |
| 6,134,457 | * 2/2001 | Klutz et al. | 324/428 |
| 6,191,590 | * 2/2001 | Klutz et al. | 324/428 |

* cited by examiner

Primary Examiner—Nguyen T. Vo
Assistant Examiner—Charles N. Appiah
(74) Attorney, Agent, or Firm—Venable; Robert J. Frank; Michael A. Sartori

(57) ABSTRACT

A method for detecting a full charge state has the steps of obtaining a first data series including first to N-th data items, the first to N-th data items of the first data series corresponding to battery voltages measured at first sampling intervals during a first sampling time period, respectively; and obtaining a second data series including first to N-th data items, the first to N-th data items of the second data series corresponding to battery voltages measured at second sampling intervals during a second sampling time period, respectively. A predetermined time delay is provided between a beginning of the first sampling time period and a beginning of the second sampling time period, and the second sampling intervals are the same as the first sampling intervals. The method has the further steps of comparing an i-th data item of the first data series and an i-th data item of the second data series (i=1, 2, . . . , N) to obtain a number of times that the i-th data item of the second data series is smaller than the i-th data item of the first data series; and judging whether or not the battery has reached the full charge state on the basis of a ratio of the number of times to N.

18 Claims, 10 Drawing Sheets

METHOD FOR DETECTING FULL CHARGE STATE OF BATTERY

BACKGROUND OF THE INVENTION

The present invention relates to a method for detecting a full charge state of a battery during a charging operation, a device employing the method, and a cellular telephone employing the method.

Since a secondary battery (hereinafter simply referred to as a battery) is reusable by recharging, it is widely used as a power supply for a portable device such as a cellular telephone. However, overcharging damages a battery to cause reduction in its capacity and shortening of its useful life. Therefore, overcharging is generally prevented by continuous monitoring of a battery voltage during a charging operation. To put it concretely, since a battery voltage lowers slightly after the battery has reached a full charge state, it is a common practice to detect the full charge state of the battery by detecting the slight lowering $-\Delta V$ in the battery voltage during the charging operation.

An example of a conventional method for detecting a full charge state of a battery will be described below.

Initially, a battery voltage is measured by, for example, a measuring circuit (see FIG. 6), and is then converted into digital data by an A/D converter (not shown in the figure) of the measuring circuit. To assure the accuracy, the battery voltage is measured a plurality of times to obtain a plurality of sampling data items, and a mean value of the sampling data items is used as evaluation data for the battery voltage. A detection of a full charge state of the battery is rendered on the basis of whether or not the evaluation data (or the mean value) has reached a predetermined reference value.

In the above-mentioned conventional method, it is necessary to obtain an accurate battery voltage in order to accurately determine whether or not the battery has reached the full charge state. However, the A/D converter which can be mounted on, for example, a cellular telephone to enable the detection of the full charge state has a limited resolution, which resulted in a significant error in A/D conversion process in actuality. Further, the battery which is being charged exhibits a fluctuation in the battery voltage in accordance with a variation in power dissipation of the cellular telephone. The conventional practice of sampling the battery voltage a plurality of times to derive the mean value which is then used as the evaluation data is intended to accommodate for such problem.

Nevertheless, during the actual operation of the cellular telephone as a portable device, the power dissipation of the cellular telephone frequently undergoes a sporadic sudden change, which cannot be fully accommodated for by the above-described data mean technique. The known way to accommodate for this situation is to increase the number of the sampling data items which are used in determining the mean value. However, under the current status of the art, it is difficult to provide a satisfactory result of the detection of the full charge state even if the number of the sampling data items is increased. Further, when the number of the sampling data items is increased, the amount of data processing required for the detection of the full charge state is voluminous, increasing a load on the cellular telephone. By way of example, a cellular telephone of US-CDMA type involves a greater variation in power dissipation in comparison to a cellular telephone of US-TDMA type, and requires, in one instance, that a measurement of the battery voltage is conducted two hundred times in order to render a single determination. The amount of data processing required for the cellular telephone of US-CDMA type is as much as nearly twice that required for the cellular telephone of US-TDMA type.

SUMMARY OF THE INVENTION

It is an object of the present invention to provide a method for accurately detecting a full charge state of a battery during a charging operation while decreasing the amount of data processing required, a device employing the method, and a cellular telephone employing the method.

According to an aspect of the present invention, a method for detecting a full charge state of a battery during a charging operation, comprising the steps of: obtaining a first data series including first to N-th data items, where N is a predetermined positive integer not less than 2, the first to N-th data items of the first data series corresponding to battery voltages measured at first sampling intervals during a first sampling time period, respectively; obtaining a second data series including first to N-th data items, the first to N-th data items of the second data series corresponding to battery voltages measured at second sampling intervals during a second sampling time period, respectively, a predetermined time delay being provided between a beginning of the first sampling time period and a beginning of the second sampling time period, the second sampling intervals being the same as the first sampling intervals; comparing an i-th data item of the first data series and an i-th data item of the second data series to obtain a number of times that the i-th data item of the second data series is smaller than the i-th data item of the first data series, where i=1, 2, . . . , N; and judging whether or not the battery has reached the full charge state on the basis of a ratio of the number of times to N.

The first sampling intervals may be even intervals, and the second sampling intervals may be even intervals. Further, The first sampling intervals may be uneven intervals, and the second sampling intervals may be uneven intervals.

The second sampling time period may begin after an end of the first sampling time period. Further, the second sampling time period may begin during the first sampling time period.

In the step of comparing, the i-th data item of the second data series is the (i+j)-th data item of the first data series, where j is a predetermined positive integer not more than N−1.

According to the other aspect of the present invention, a device for detecting a full charge state of a battery during a charging operation, comprises: a measuring circuit for measuring a battery voltage; and a controller for controlling the measuring circuit. The controller obtains a first data series including first to N-th data items, where N is a predetermined positive integer not less than 2, the first to N-th data items of the first data series corresponding to battery voltages measured by the measuring circuit at first sampling intervals during a first sampling time period, respectively; the controller obtains a second data series including first to N-th data items, the first to N-th data items of the second data series corresponding to battery voltages measured by the measuring circuit at second sampling intervals during a second sampling time period, respectively. A predetermined time delay is provided between a beginning of the first sampling time period and a beginning of the second sampling time period, the second sampling intervals are the same as the first sampling intervals. The controller compares an i-th data item of the first data series and an i-th data item of the second data series to obtain a number of times that the i-th data item of the second data series is smaller than the i-th data item of the first data series, where i=1, 2, . . . , N, and judges whether or not the battery has reached the full charge state on the basis of a ratio of the number of times to N.

According to a further aspect of the present invention, a cellular telephone comprises: a measuring circuit for measuring a battery voltage of a battery; and a controller for controlling the measuring circuit and a charging circuit of a charger for the cellular telephone. The controller obtains a first data series including first to N-th data items, where N is a predetermined positive integer not less than 2, the first to N-th data items of the first data series corresponding to battery voltages measured by the measuring circuit at first sampling intervals during a first sampling time period, respectively. The controller obtains a second data series including first to N-th data items, the first to N-th data items of the second data series corresponding to battery voltages measured by the measuring circuit at second sampling intervals during a second sampling time period, respectively. A predetermined time delay is provided between a beginning of the first sampling time period and a beginning of the second sampling time period, and the second sampling intervals is the same as the first sampling intervals. The controller compares an i-th data item of the first data series and an i-th data item of the second data series to obtain a number of times that the i-th data item of the second data series is smaller than the i-th data item of the first data series, where i=1, 2, . . . , N, and judges whether or not the battery has reached the full charge state on the basis of a ratio of the number of times to N. The controller causes the charging circuit of the charger to stop charging when the controller judges that the battery has reached the full charge state.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Further scope of applicability of the present invention will become apparent from the detailed description given hereinafter. However, it should be understood that the detailed description and specific examples, while indicating preferred embodiments of the invention, are given by way of illustration only, since various changes and modifications will become apparent to those skilled in the art from the detailed description.

First Embodiment

Figure 1:
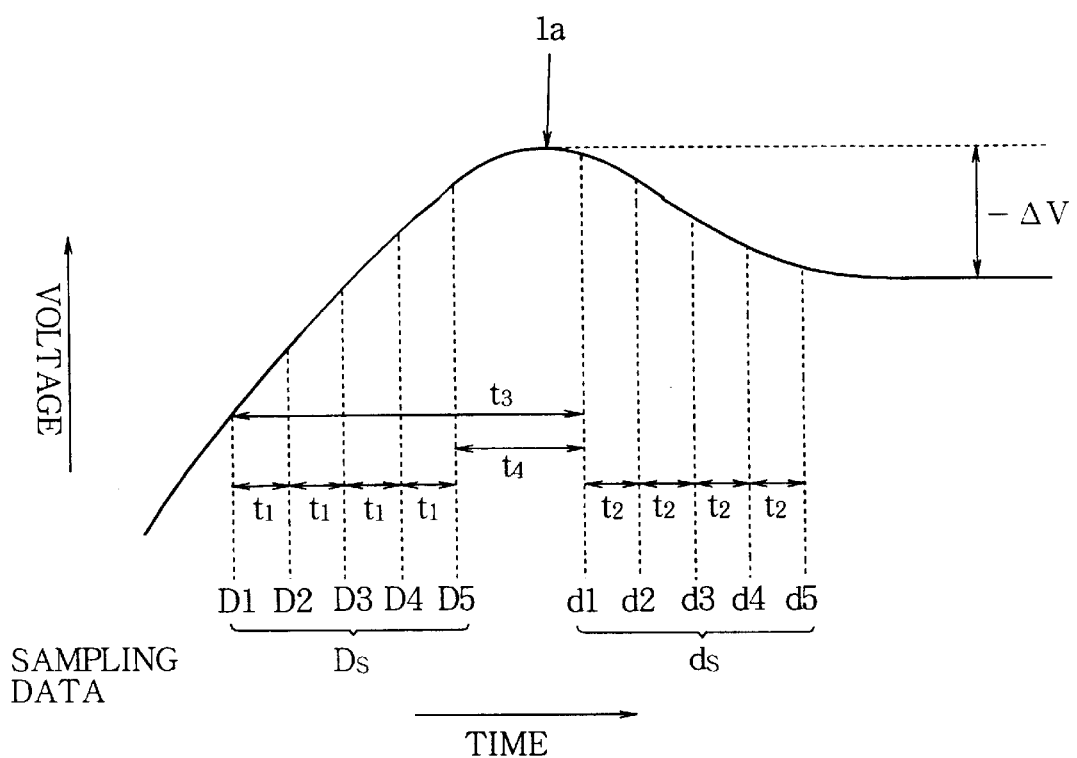
FIG. 1 is a diagram for explaining a method for detecting a full charge state of a battery according to a first embodiment of the present invention.
Figure 6:
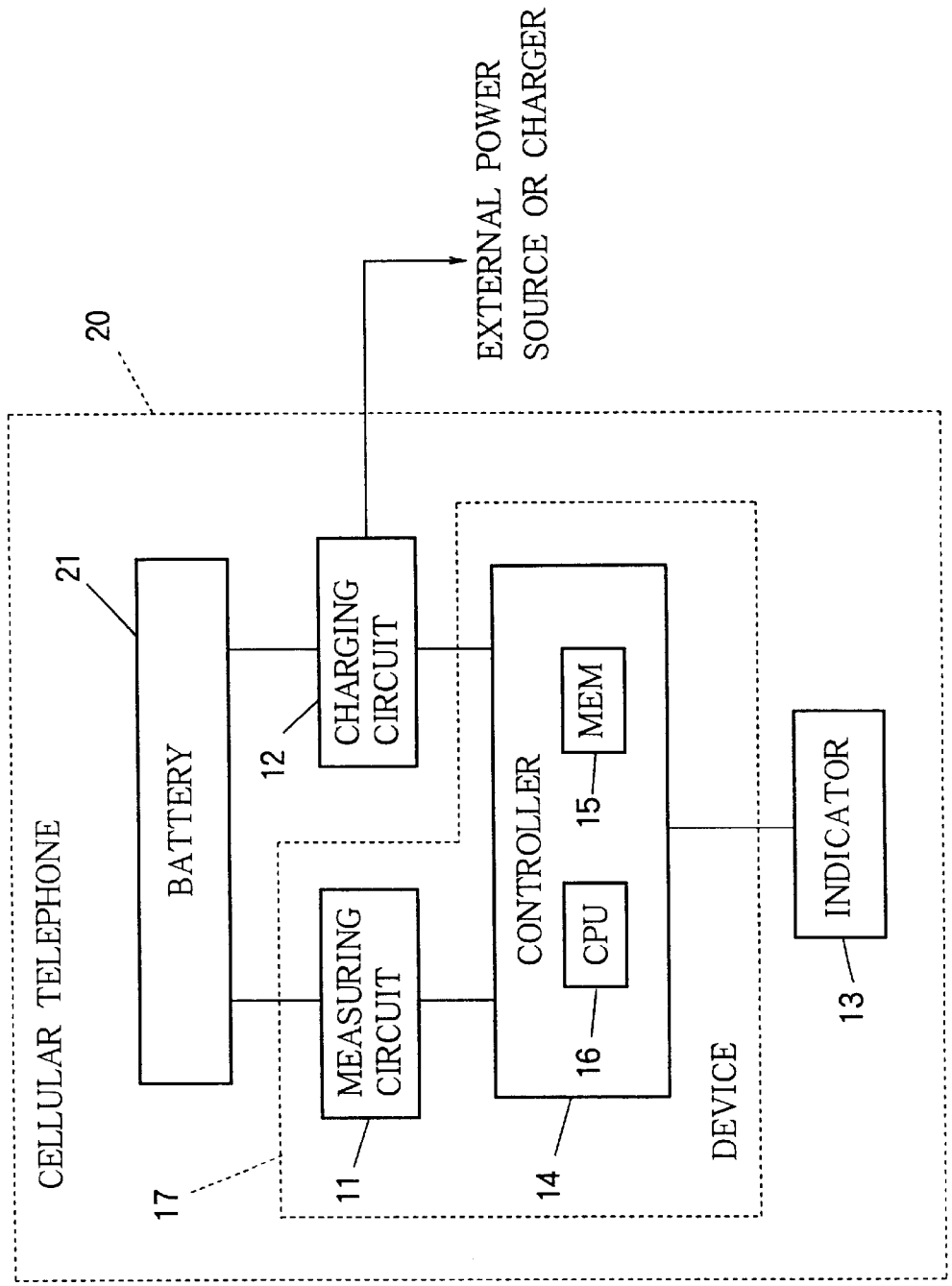
FIG. 6 is a block diagram showing a cellular telephone including a device for detecting a full charge state of a battery according to a sixth embodiment of the present invention.

FIG. 1 is a diagram for explaining a method for detecting a full charge state of a battery during a charging operation according to a first embodiment of the present invention. In FIG. 1, a horizontal axis indicates time, a vertical axis indicates a battery voltage during a charging operation, and a curve 1 indicated by a thick solid line represents a change in the battery voltage around a peak voltage (i.e., a voltage at a full charge state) $1a$ Further, a block diagram of a cellular telephone as a portable information terminal which can employs the method according to the first embodiment is shown in FIG. 6, which is described in the sixth embodiment.

In the method according to the first embodiment, a battery voltage is measured a plurality of times (e.g., N times) at given regular intervals (referred to as sampling intervals) $t_1$ or $t_2$ to obtain a data series Ds or ds including a plurality of sampling data items (e.g., first to N-th data items), where N is a predetermined positive integer not less than 2. Each data series Ds or ds (i.e., a series of voltage data) is treated as a single group. Further, the measurement of the data series Ds or ds is conducted at a given regular interval (referred to as a series interval) $t_4$, which indicates a time interval between an end of the proceeding data series Ds (hereinafter referred to as a D-series) and a beginning of the following data series ds (hereinafter referred to as a d-series), that is, a time interval between an end of a first sampling time period corresponding to Ds in FIG. 1 and a beginning of a second sampling time period corresponding to ds in FIG. 1.

Whether or not a slight lowering $-\Delta V$ in the battery voltage has been detected, that is, whether or not the battery 21 has reached a full charge state $1a$ is determined by comparing the sampling data items (e.g., $D_1, \ldots, D_5$) of the D-series with the sampling data items (e.g., $d_1, \ldots, d_5$) of the d-series. Further, in FIG. 1, a symbol $t_3$ indicates a time interval between the beginning of the D-series and the beginning of the d-series), that is, a time interval between a beginning of the first sampling time period and a beginning of the second sampling time period.

The sampling data items (e.g., $D_1, \ldots, D_5$) of the D-series which are previously measured and the sampling data items (e.g., $d_1, \ldots, d_5$) of the d-series which are subsequently measured are compared against each other in the sequence they are sequentially measured in the respective data series Ds or ds to determine the relative magnitudes. More specifically, an i-th data item $D_i$ of the D-series and an i-th data item $d_i$ of the d-series are compared to obtain a number of times that the i-th data item $d_i$ of the d-series is smaller than the i-th data item $D_i$ of the D-series (i.e., $D_i > d_i$), where i=1, 2, . . . , N. Subsequently, a difference $\Delta_i (=D_i - d_i)$ is calculated and a sign of each difference $\Delta_1$ to $\Delta_N$ is obtained. A symbol N indicates the number of times of sampling in each series, and in FIG. 1, N is set to 5. However, N is not limited to 5.

Subsequently, a ratio of the number of times in which the sampling data items $d_i$ of the d-series is smaller, that is, the number of times in which the differences ($\Delta_1$ to $\Delta_N$) are positive relative to the number of times N of each data series is compared against a predetermined reference value. A determination of whether or not the slight lowering $-\Delta V$ has been detected is made on the basis of whether or not this ratio is equal to or higher than the reference value. When the ratio is equal to or higher than the reference value, a determination is rendered that the slight lowering $-\Delta V$ has been detected. If the ratio is less than the reference value, a determination is rendered that the slight lowering $-\Delta V$ has not been detected.

In the method according to the first embodiment, the determination is made in accordance with the ratio of the number of times, in which the i-th data item $d_i$ of the dseries is smaller than the i-th data item $D_i$ of the D-series, to the number of times N. Accordingly, if a fluctuation in the battery voltage which is attributable to a variation in the power dissipation is high, the influence by the fluctuation is exerted upon only one sampling data item. Therefore, the determination is little influenced by such fluctuation, thus allowing the determination to be rendered with good accuracy and with a relatively few number of sampling times. By the way, if the battery voltage is measured to derive the mean value as in the conventional art, such mean value will be influenced by a fluctuation in the battery voltage which is attributable to a variation in the power dissipation. It should be understood that the greater the variation, the greater the influence in the conventional art.

In general, the battery voltage during the charging operation continues to increase monotonously except in an overcharged region or a temporally fluctuating region. In the method according to the first embodiment, two sampling data items (e.g., $D_1$ and $d_1$) which are directly compared against each other are sampled at times which are sufficiently spaced apart, that is, there may be a significant difference in the magnitude of both sampling data items, so that the possibility is reduced that an incorrect sign of the difference $\Delta_i$ may be produced as a result of an error in the A/D conversion.

The sampling interval $t_1$ or $t_2$, the reference value, and time length of the data series (e.g., a time interval from the sampling of the data item $D_1$ to the sampling of the data item $D_5$, that is, a time interval between a beginning of a sampling time period and an end of the same sampling time period) are determined in consideration of not only a charging condition and characteristic of the battery, but of a fluctuating characteristic in the power dissipation of the device in which the battery is assembled, in particular, a time length during which a temporary fluctuation occurs. The time length during which a temporary fluctuation in the power dissipation occurs can be readily inferred beforehand from a design and a specification of the device. It is necessary that the time length of the data series be chosen sufficiently longer than the time length during which the temporary fluctuation in the power dissipation occurs. It is necessary to determine the reference value in consideration of a ratio of the time length of the data series with the respect to the time length during which the temporary fluctuation in the power dissipation occurs. Conversely, it is necessary to choose the sampling interval $t_1$ or $t_2$ so that it is longer than the length of the time during which the temporary fluctuation in the power dissipation occurs.

A cellular telephone including a device to which the method of the first embodiment is applied will be described later as a sixth embodiment.

In consideration of the fact that the number of times N of sampling in each data series is basically constant, the reference value may be defined as a number of times rather than a reference ratio. In this case, whether or not the number of times, that the data item in the d-series is smaller than the data item in the D-series, is higher than the reference value is determined. Further, it is possible to change the number of times N of sampling in each data series in the course of the measurement. However, when the number of times N is changed, the corresponding reference value (or number of times) must be changed accordingly.

Further, a relative relation of time between the D-series and the d-series is not limited to that described above, and a various modifications are possible.

Second Embodiment

FIGS. 2A to 2F are diagrams for explaining a method for detecting a full charge state of a battery during a charging operation according to a second embodiment of the present invention. In FIGS. 2A to 2F, a horizontal axis indicates time, a vertical axis indicates a battery voltage during the charging operation, and a curve 1 indicated by a thick solid line represents a change in the battery voltage around a peak voltage 1a. Further, a cellular telephone shown in FIG. 6 can employ the method according to the second embodiment.

The method according to the second embodiment is the same as that according to the first embodiment except in that a determination whether or not a battery has reached a full charge state is rendered every time period $t_1$ (or $t_2$).

In the method according to the second embodiment, a controller 14 (see FIG. 6) obtains the D-series including first to N-th data items. The first to N-th data items of the D-series corresponds to the battery voltages measured at sampling intervals $t_1$ during a first sampling time period (that is, a time period corresponding to a symbol Ds in FIGS. 2A to 2F), respectively. The controller 14 obtains the d-series including first to N-th data items. The first to N-th data items of the d-series correspond to battery voltages measured at sampling intervals $t_2$ during a second sampling time period (that is, a time period corresponding to a symbol Ds in FIGS. 2A to 2F), respectively. A predetermined time delay $t_3$ is provided between a beginning of the first sampling time period (a beginning of the D-series) and a beginning of the second sampling time period (a beginning of the d-series). Further, the sampling intervals $t_2$ are the same as the sampling intervals $t_1$. In this embodiment, the sampling intervals $t_1$ are even intervals, and the sampling intervals $t_2$ are also even intervals.

The controller 14 subsequently compares an i-th data item $D_i$ of the D-series and an i-th data item $d_i$ of the d-series to obtain a number of times $N_1$ that the i-th data item $d_i$ of the d-series is smaller than the i-th data item $D_i$ of the D-series, where i=1, 2, . . . , N, and judges whether or not the battery has reached the full charge state on the basis of a ratio of the number of times $N_1$ to the number of times N of sampling in each data series (i.e., $N_1/N$). In this embodiment, the determination is conducted every time period $t_1$ (or $t_2$).

Figure 2A:
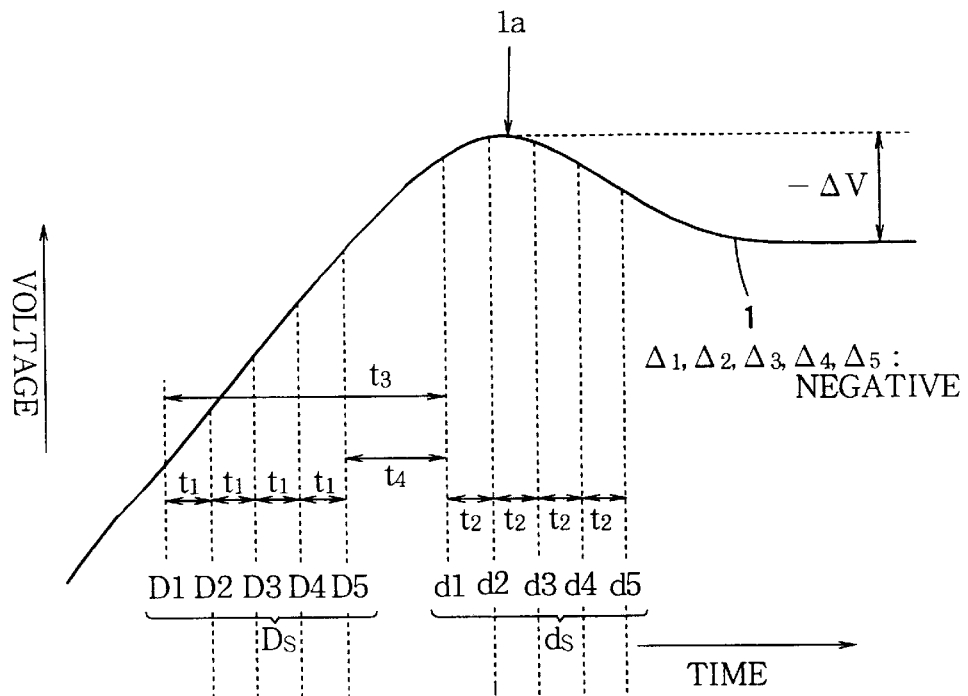
FIGS. 2A to 2F are diagrams for explaining a method for detecting a full charge state of a battery according to a second embodiment of the present invention.
Figure 2B:
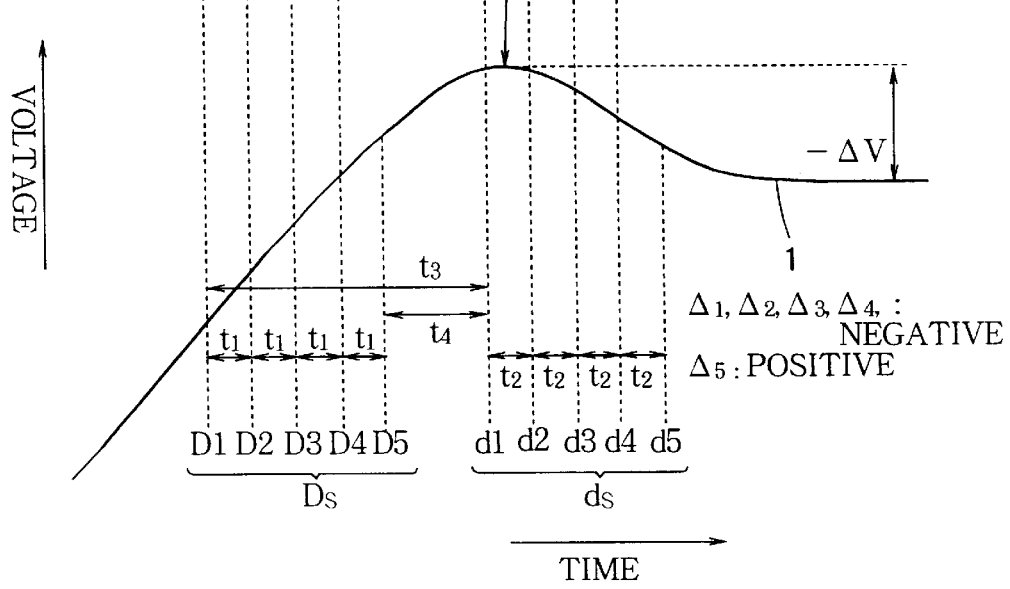
Figure 2C:
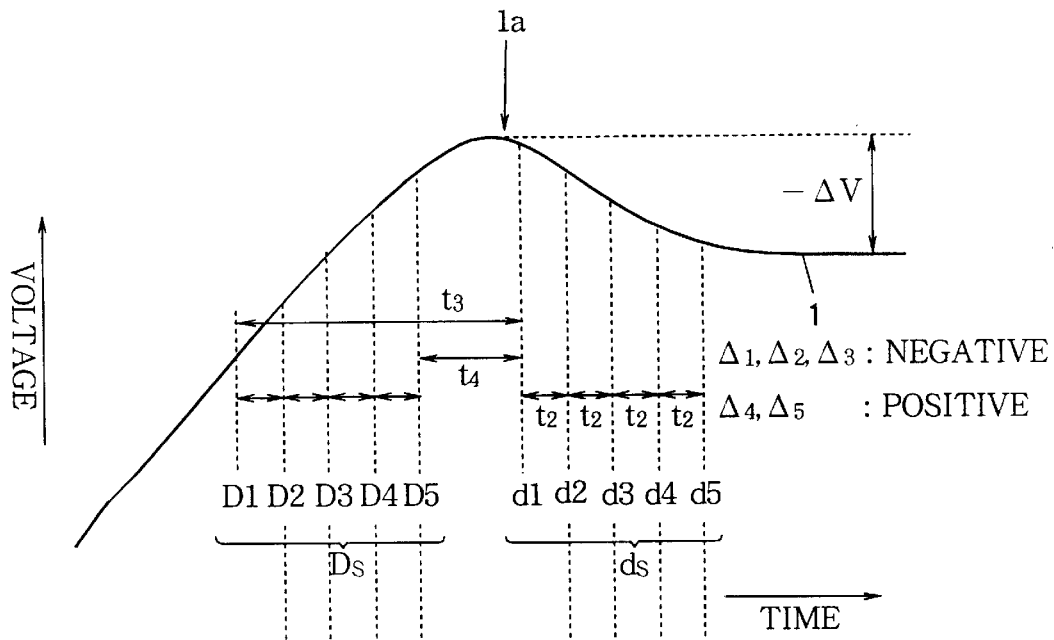

As shown in FIG. 2A, the determination is first rendered to obtain a result that $\Delta_1$ to $\Delta_5$ are all negative. As shown in FIG. 2B, after a lapse of the time $t_1$, the determination is subsequently rendered to obtain a result that $\Delta_1$ to $\Delta_4$ are negative and $\Delta_5$ is positive. As shown in FIG. 2C, after a lapse of the time $t_1$, the determination is subsequently rendered to obtain a result that $\Delta_1$ to $\Delta_3$ are negative, and $\Delta_4$ and $\Delta_5$ are positive.

Figure 2D:
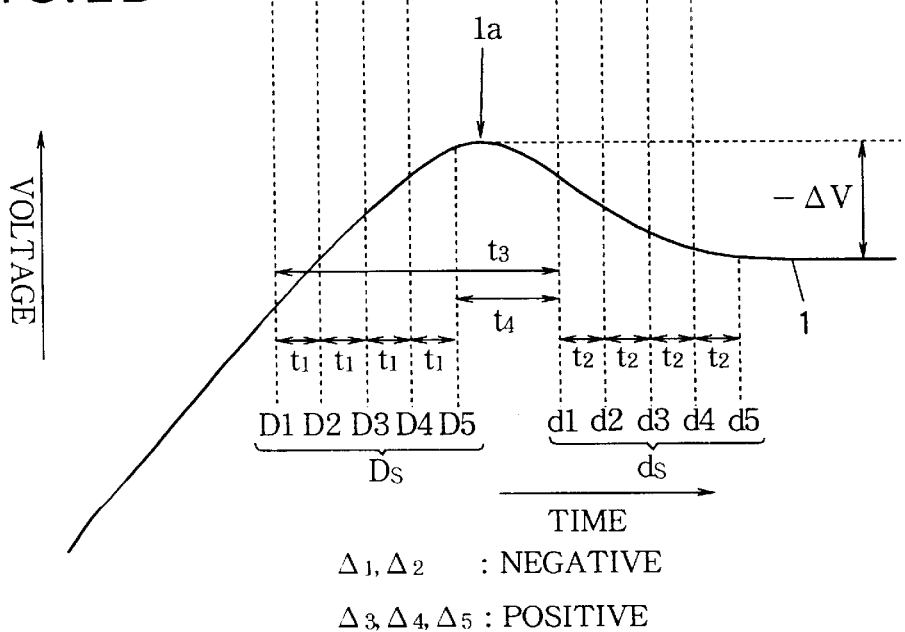
Figure 2E:
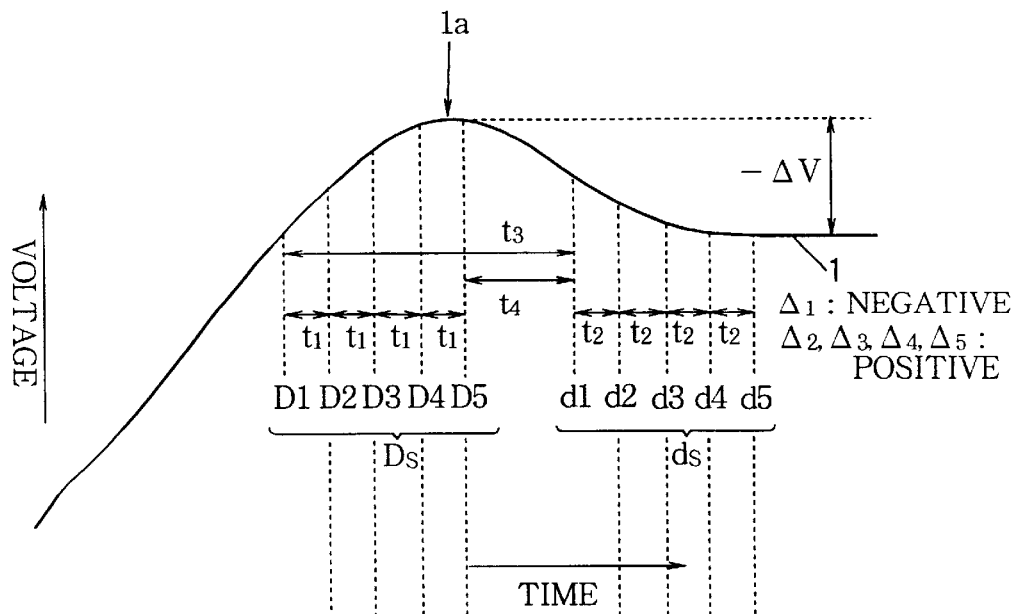
Figure 2F:
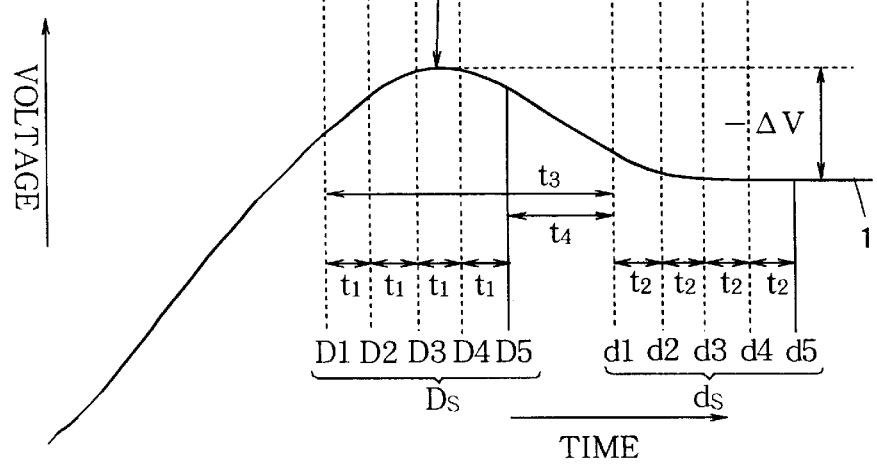

As shown in FIG. 2D, after a lapse of the time $t_1$, the determination is subsequently rendered to obtain a result that $\Delta_1$ and $\Delta_2$ are negative, and $\Delta_3$ to $\Delta_5$ are positive. If the predetermined reference ratio is set to 3/5, the full charge state is detected at this time. Further, if the predetermined reference ratio is set to 4/5, the full charge state is detected at the state shown in FIG. 2E. Furthermore, if the predetermined reference ratio is set to 5/5, the full charge state is detected at the state shown in FIG. 2F.

Third Embodiment

Figure 3:
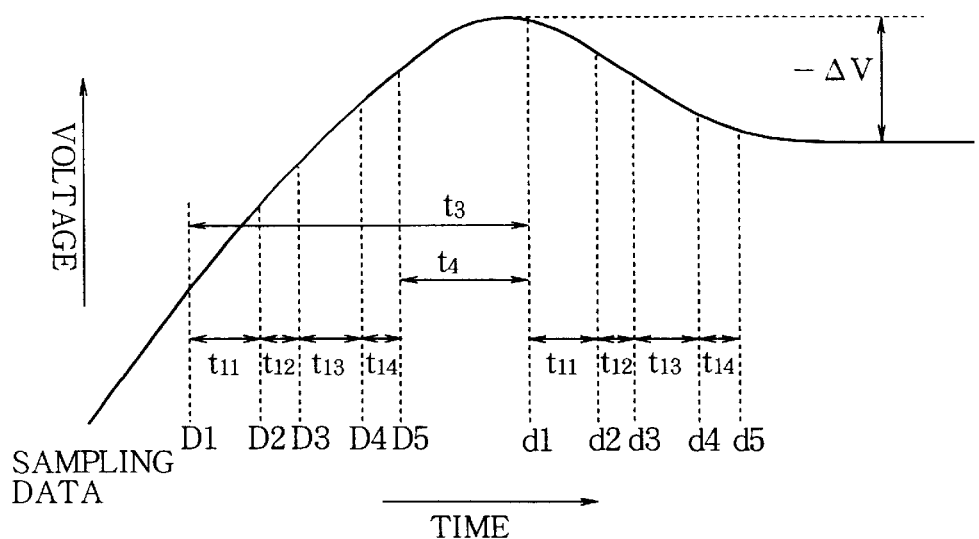
FIG. 3 is a diagram for explaining a method for detecting a full charge state of a battery according to a third embodiment of the present invention.

FIG. 3 is a diagram for explaining a method for detecting a full charge state of a battery according to a third embodiment of the present invention. In FIG. 3, a horizontal axis indicates time, a vertical axis indicates a battery voltage during the charging operation, and a curve 1 indicated by a thick solid line represents a change in the battery voltage around a peak 1a.

The method according to the third embodiment is the same as the first or second embodiment except that the sampling intervals $t_{11}$, $t_{12}$, $t_{13}$, $t_{14}$, and $t_{15}$ may not be equal each other, that is, the sampling intervals are uneven. However, the patterns of sampling intervals ($t_{11}$, $t_{12}$, $t_{13}$, ...) in the corresponding data series Ds and ds which are compared against each other must be the same, as illustrated in FIG. 3.

Fourth Embodiment

Figure 4:
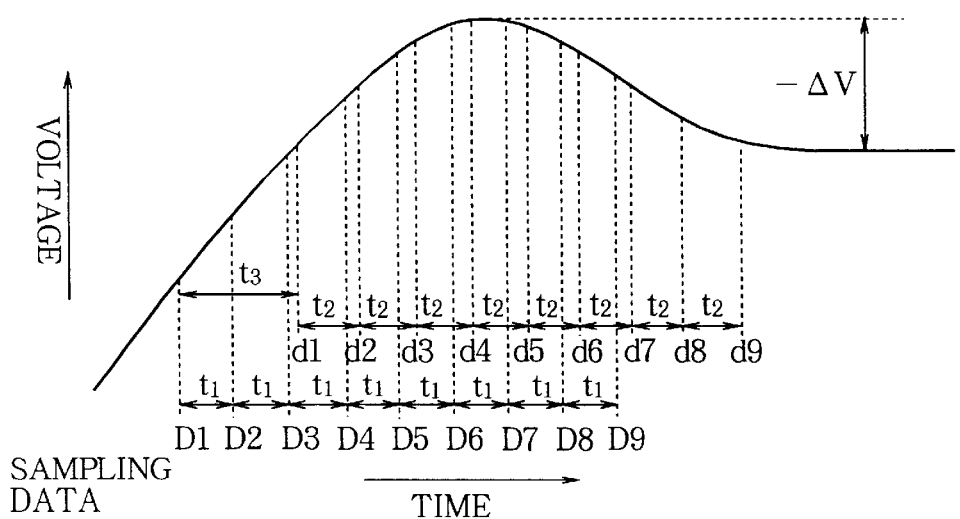
FIG. 4 is a diagram for explaining a method for detecting a full charge state of a battery according to a fourth embodiment of the present invention.

FIG. 4 is a diagram for explaining a method for detecting a full charge state of a battery according to a third embodiment of the present invention. In FIG. 4, a horizontal axis indicates time, a vertical axis indicates a battery voltage during the charging operation, and a curve 1 indicated by a thick solid line represents a change in the battery voltage around a peak voltage 1a.

The method according to the fourth embodiment is the same as the first, second or third embodiment except that the sampling of the d-series is started before completing the sampling of the D-series.

For example, the sampling of the d-series may be started concurrently with, but after a certain time delay with respect to the beginning of the sampling of the D-series. To give an example, the sampling may take place in the sequence of $D_1$, $D_2$, $D_3$, $d_1$, $D_4$, $d_2$, $D_5$, $d_3$, $D_6$, $d_4$, $D_7$, ..., $D_{N-1}$, $d_{N-3}$, $D_N$, $d_{N-2}$, $d_{N-1}$, and $d_N$, as shown in FIG. 4. In other words, a time interval (time delay) $t_3$ from the sampling of the data item $D_1$ to the sampling of the data item $d_1$ may be less than the time interval required for the measurement of all data items $d_1$, ..., $d_5$ belonging to the d-series. In this manner, the length of time required for a single determination can be reduced. However, as mentioned previously, it is preferred that the times when the two data items (e.g., $D_1$ and $d_1$) which are directly compared against each other be sufficiently spaced apart in order to eliminate the influences attributable to errors in the A/D conversion.

Fifth Embodiment

Figure 5:
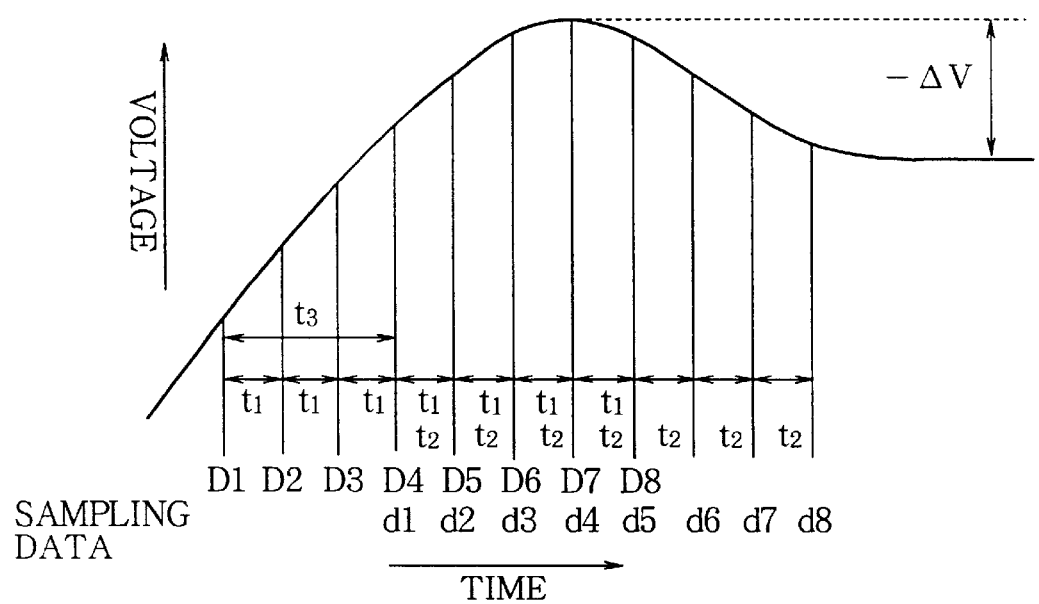
FIG. 5 is a diagram for explaining a method for detecting a full charge state of a battery according to a fifth embodiment of the present invention.

FIG. 5 is a diagram for explaining a method for detecting a full charge state of a battery according to a fifth embodiment of the present invention. In FIG. 5, a horizontal axis indicates time, a vertical axis indicates a battery voltage during the charging operation, and a curve 1 indicated by a thick solid line represents a change in the battery voltage around a peak voltage 1a.

The method according to the fifth embodiment is the same as the first, second, or third embodiment except that the sampling of the d-series is started before completing the sampling of the D-series, and the timing of sampling data item in the D-series and the timing of the sampling data item in the d-series may be chosen to be coincident with each other. In order to bring the timings of sampling (or measuring) the both series into coincidence, a time interval (or a time delay) from the sampling of the data item $D_1$ to the sampling of the data item $d_1$ may be chosen to be an integral multiple of the sampling interval $t_1$. At this end, the series interval $t_4$ may be chosen to be an integral multiple of the sampling interval $t_1$. When such choice is employed, one data item which is measured at a given timing may be used in both D- and d-series. For example, one data item which is measured at a given timing represents $D_M$ (M is a positive integer) and $d_1$, simultaneously. A data item which is measured in immediately following relationship represents $D_{M+1}$ and $d_2$ simultaneously. This allows the number of samplings or the data items to be substantially reduced, and accordingly, when such technique is applied to an actual device, a load on the device in terms of a memory capacity and a processing rate of the voltage sampling circuit may be alleviated. In each of the instances mentioned above, it is necessary that the data items which constitute each data series satisfies the requirement mentioned above as to the pattern of time interval at which they are sampled.

Sixth Embodiment

A cellular telephone according to a sixth embodiment of the present invention, that includes a device employing the method according to the above-described first embodiment, will be described in detail below. However, the cellular telephone of the sixth embodiment may employ the other method according to the above-described second, third, fourth or fifth embodiment in place of the method according to the first embodiment.

As shown in FIG. 6, a cellular telephone according to the sixth embodiment includes a device 17 for detecting a full charge state of a battery 21 of the cellular telephone 20, a charging circuit 12 for charging the battery 21, and an indicator 13 for indicating a state of charge by an LED (not shown in the figure), for example. The device 17 includes a measuring circuit 11 for measuring a battery voltage of the battery 21 and a controller 14 for controlling operation of the entire cellular telephone 20. The controller 14 has a CPU 16 and a memory 15.

The measuring circuit 11 measures the voltage of the battery 21 which is to be charged. In the cellular telephone 20 according to this embodiment, the measuring circuit 11 includes an A/D converter (not shown in the figure) which converts measured data into a digital value and sends it to the controller 14. The measuring circuit 11 operates in accordance with a command from the controller 14 as will be described later.

The charging circuit 12 charges the battery 21. The charging circuit 12 is designed to interrupt the charging operation in response to an outcome of a determination rendered by the controller 14.

The indicator 13 is provided in order to advise a user about a state of execution of the charging operation. In the cellular telephone 20 of this embodiment, the indicator 13 comprises the LED. During the charging operation, the indicator 13 energizes the LED so as to be lit, thus indicating that it is now in the charging operation. When the battery 21 has reached a full charge state, the charging operation is interrupted and the LED flashes on and off to indicate the completion of the charging operation. A command signal regarding the state of the charge is input from the controller 14 to the indicator 13.

The controller 14 controls the operation of the entire cellular telephone 20. The controller 14 including the memory 14 and the CPU 16 is arranged such that a program stored in the memory 15 is executed by the CPU 16 to implement a variety of functions. For example, the controller 14 has the function of determining whether or not the battery has reached the full charge state on the basis of data measured by the measuring circuit 11. This determination will be described in detail later in connection with the description of the entire operation. Additionally, the measurement by the measuring circuit 11 is conducted in accordance with a command from the controller 14. The controller 14 also has a timer (not shown in the figure).

Figure 7:
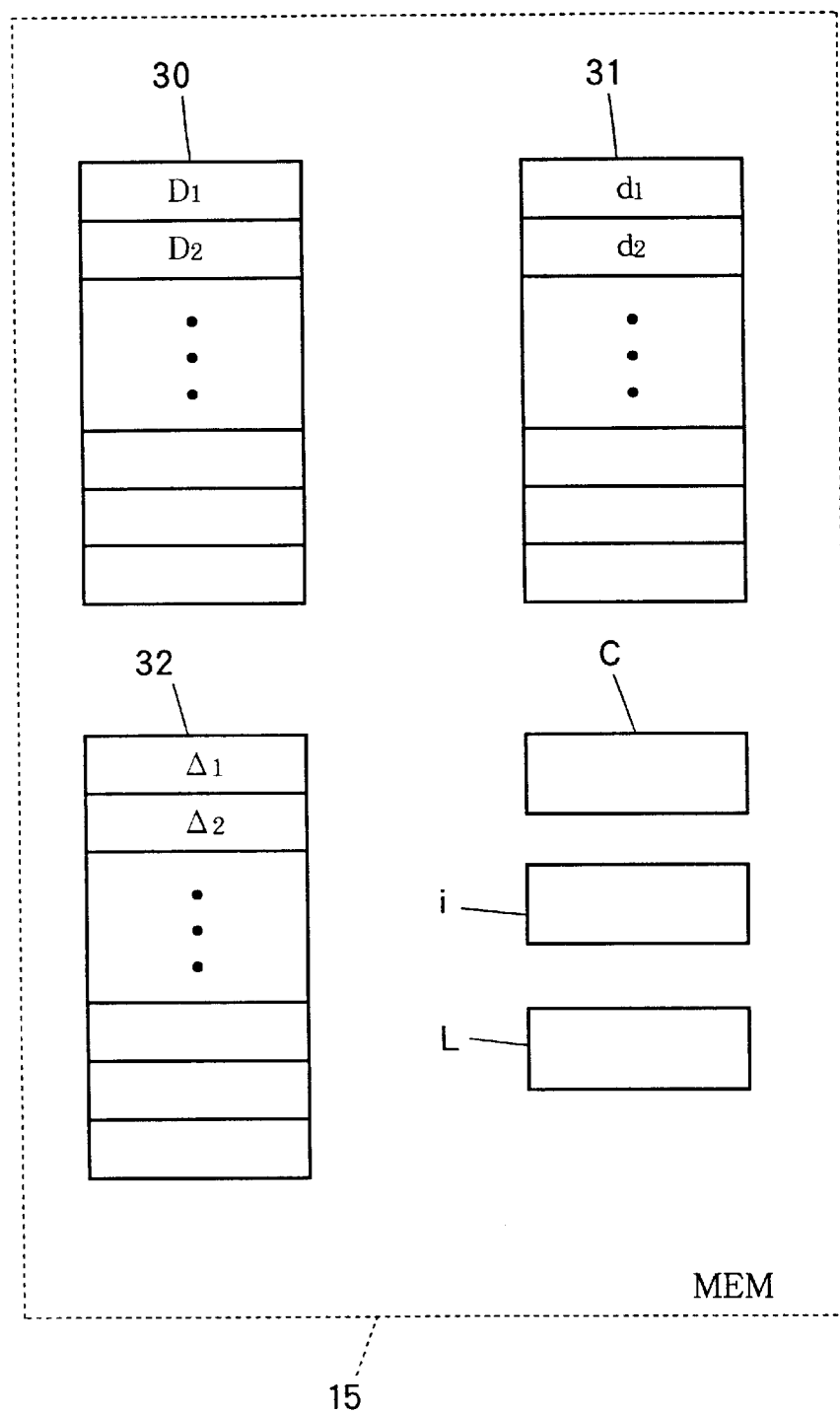
FIG. 7 is a diagram showing data tables stored in a memory of the cellular telephone of FIG. 6.

The memory 15 stores certain data such as a reference number of times L, a variable C, a variable i or the like, for example, which are used in the determination process. The memory 15 also contains various tables (e.g., a D-table 30 for the data items $D_i$ of the D-series, a d-table 31 for the data items $d_i$ of the d-series, and a difference-table 32 for the difference data items $\Delta_i$) which store results of measurement by the measuring circuit 11 in time sequences, as shown in FIG. 7. The D-table 30 stores N data items (where N is a number of times of sampling (or measuring) in each data series and is a positive integer not less then 2) of the D-series in a time sequence. The d-table 31 stores N data items in the d-series which is measured subsequent to the data in the D-series in a time sequence. Each of the data series Ds or ds comprises a plurality of data items. When it is necessary to distinguish each data item in a time sequence, the respective data item is indicated by a suffix applied thereto such as data items $D_1, D_2, D_3, \ldots, D_{N-1}, D_N$ in the D-series or data items $d_1, d_2, d_3, \ldots, d_{N-1}, d_N$ in the d-series. The difference-table 32 stores a result of calculation of a difference $\Delta_i$ between corresponding data items in the D- and d-series. Each item of the difference $\Delta_i$ is indicated by a corresponding suffix indicating the sequence of original data, such as $\Delta_1$ ($=D_1-d_1$), for example.

The term "first data series" as used in the Claims corresponds to the D-series illustrated in this embodiment. Similarly, the term "second data series" corresponds to the d-series. The term "reference value" corresponds to the reference number of times L. The term "first sampling intervals" corresponds to the sampling intervals $t_1$ and the term "second sampling intervals" corresponds to the sampling intervals $t_2$. The term "measuring circuit" corresponds to the measuring circuit 11, and the term "charging circuit" corresponds to the charging circuit 12. The term "time delay" corresponds to a time interval $t_3$ from the sampling of the data item $D_1$ to the sampling of the data item $d_1$.

An operation of the cellular telephone 20 according to the sixth embodiment will now be described with reference to FIG. 6 to FIG. 9.

When a charging start switch (not shown in the figure) of the cellular telephone 20 is turned on or when a battery 21 of the cellular telephone 20 is connected with an external power source or a charger, the controller 14 causes the charging circuit 12 to initiate its charging operation and causes the LED of the indicator 13 to be lit in order to indicate that the operation is now in the course of charging. Subsequently, the controller 14 performs the operations (steps 110 to 130) shown in FIG. 8 as described below in order to ascertain whether or not the battery 21 has reached the full charge state.

Figure 8:
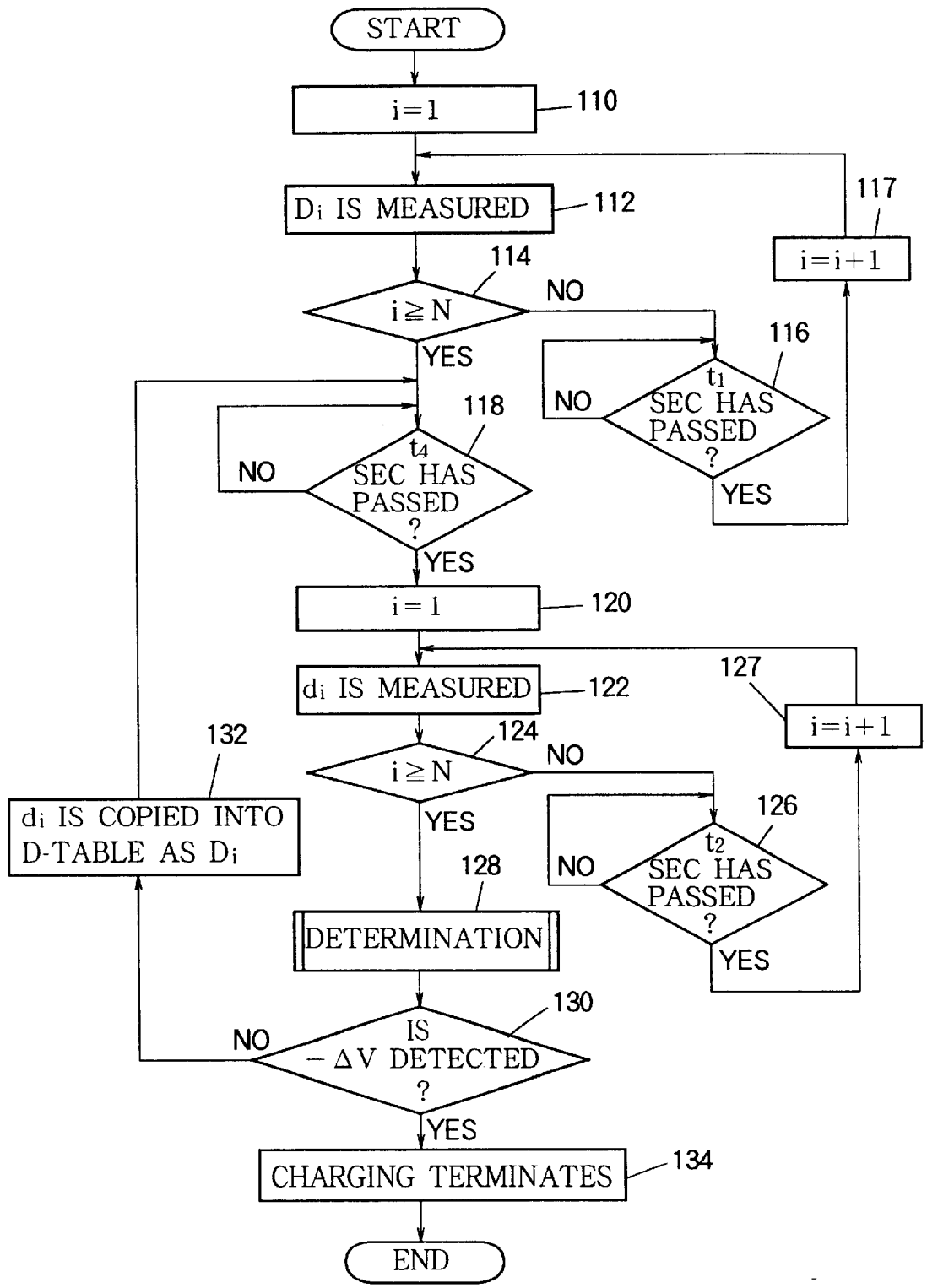
FIG. 8 is a flow chart showing operation of a controller of the cellular telephone of FIG. 6.

Referring to FIG. 8, the controller 14 first initializes a variable i (that is, sets a variable i to "1") at a step 110, where the variable i is used to recognize the number of particular operations. Subsequently, the controller 14 causes the measuring circuit 11 to measure the battery voltage of the battery 21 in order to obtain the data item $D_i$ in the D-series, at a step 112. At the same time, the controller 14 resets and restarts the timer, thus monitoring whether or not the elapsed time has reached the sampling interval $t_1$ and whether or not the elapsed time has reached the series interval $t_4$, which will be described later.

Subsequently, at a step 114, the controller 14 determines whether or not the number of measurements (i.e., the number of samplings) has reached the predetermined number of times N, that is, whether or not the sampling of the data items $D_i$ in the D-series has been completed, in accordance with the value of the variable i. If the number of measurements has not reached the number of times N, the controller 14 stays in standby condition after the measurement of the step 112, while determining whether or not the sampling interval $t_1$ has passed at a step 116. After the sampling interval $t_1$ has passed, the value of the variable i is incremented by one at a step 117 and the process returns to the step 112, thus repeating a similar operation shown at the steps 112, 114, 116 and 117 until the variable i has reached the number of times N. It is to be understood that the controller 14 stores the data items $D_i$ which have been measured at the step 112 in the D-table 30 in a time sequence.

At the step 114, if the number of measurements has reached the number of times N, that is, if the sampling of data items $D_i$ in the D-series has been completed, the process proceeds to a step 118.

At the step 118, the controller 14 determines whether or not the series interval $t_4$ has passed since the last measurement of the voltage by the measuring circuit 11. If the series interval $t_4$ has not yet passed, the controller 14 stays in standby condition while determining whether or not the series interval $t_4$ has passed. When the series interval $t_4$ has passed, the variable i is initialized (that is, sets the variable i to "1") anew, at a step 120, and subsequently the process proceeds to a step 122.

At the step 122, the controller 14 causes the measuring circuit 11 to measure the voltage of the battery 21 in order to obtain the data items $d_i$ in the d-series. At the same time, the controller 14 resets and restarts the timer, thus monitoring whether or not the elapsed time has reached the sampling interval $t_2$ and whether or not the elapsed time has reached the series interval $t_4$.

Subsequently, at a step 124, the controller 14 determines whether or not the number of measurements has reached the predetermined number of times N, that is, whether or not the sampling of the data items $d_i$ in the d-series has been completed, in accordance with the value of the variable i. If the number of measurements has not reached the number of times N, the controller 14 stays in standby condition after the measurement of the step 122, while determining whether or not the sampling interval $t_2$ has passed at a step 126. After the sampling interval $t_2$ has passed, the value of the variable i is incremented by one at a step 127 and the process returns to the step 122, thus repeating a similar operation shown at the steps 122, 124, 126 and 127 until the variable has reached the number of times N. It is to be understood that the controller 14 stores the data items $d_i$ which have been measured at the step 122 in the d-table 31 in a time sequence.

At the step 124, if the number of measurements has reached the number of times N, that is, if the sampling of data items $d_i$ in the d-series has been completed, the process proceeds to a step 128.

At the step 128, the controller 14 determines whether or not the battery 21 has reached the full charge state. This determination is rendered by comparing the data items $D_i$ in the D-series and the data items $d_i$ in the d-series against each other to determine whether or not the slight lowering $-\Delta V$ in the battery voltage (see FIG. 1, for example) has been detected. The detail of this determination will be described later with reference to FIG. 9.

The controller 14 then ascertains whether or not the slight lowering $-\Delta V$ in the battery voltage has been detected, at a step 130. If the slight lowering $-\Delta V$ has not been detected as a result of ascertaining, the process proceeds to a step 132 where the content of the d-table 31 is copied into the D-table 30. The new content of the D-table 30, that is, the previous content of the d-table 31 will be treated as the data items $D_i$ in the D-series during the next determination. After the step 132, the process by the controller 14 returns to the step 118 where a similar operation is repeated until the detection of the slight lowering $-\Delta V$ is ascertained at the step 130.

When the detection of the slight lowering $-\Delta V$ is ascertained at the step 130, the controller 14 issues a charging interrupt command to the charging circuit 12 and the indicator 13 in order to terminate the charging operation. The charging circuit 12 terminates the charging operation in response thereto at a step 134. The indicator 13 causes the LED to flash on and off to announce the termination of the charging operation to a user.

Figure 9:
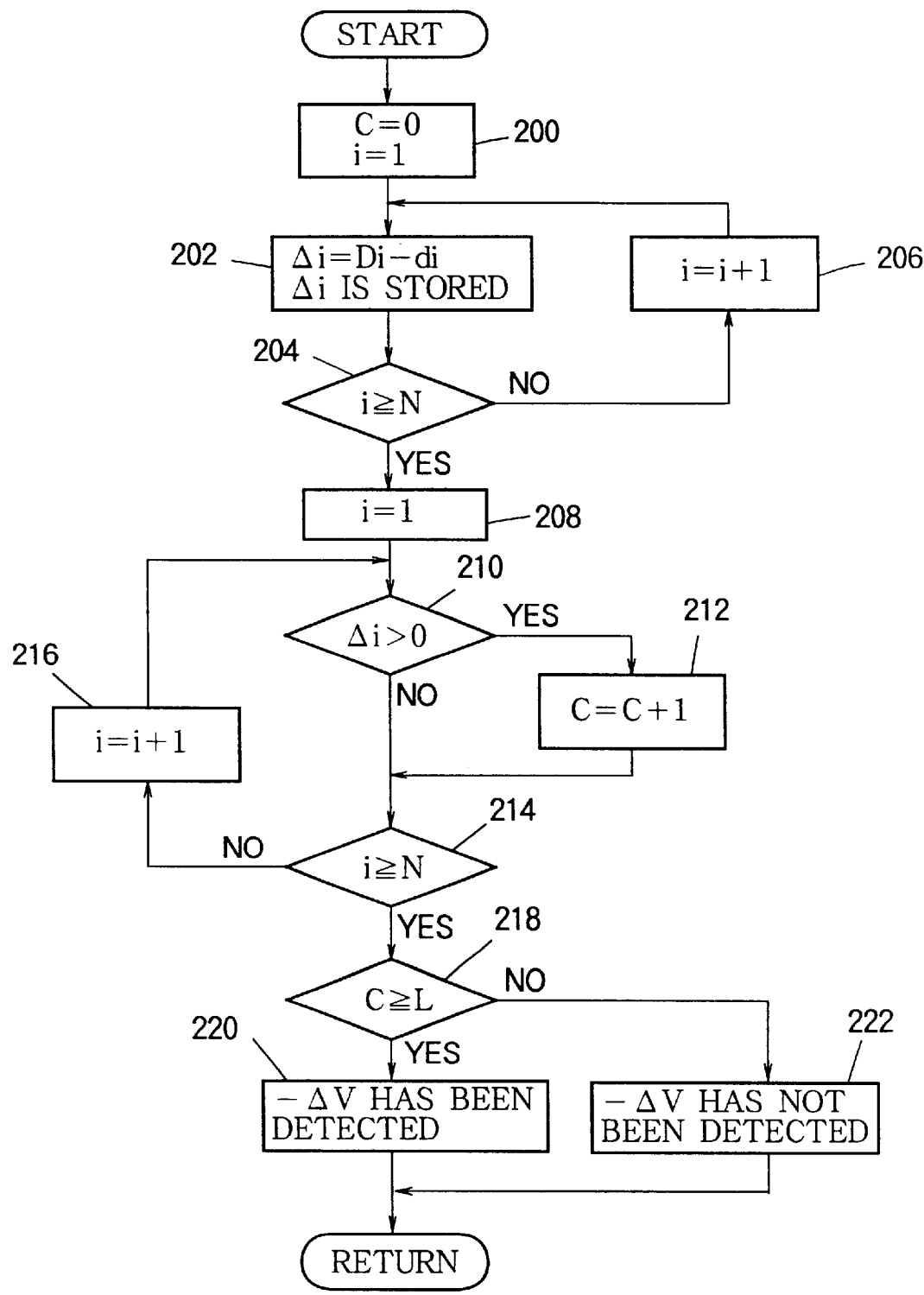
FIG. 9 is a flow chart showing a determination process of FIG. 8 in detail.

Next, the determination process at the step 128 in FIG. 8 will be described with reference to FIG. 9 in detail.

First, the controller 14 initializes the variable C and the variable i (that is, sets C to "0" and i to "1") at a step 200. The variable C is used for counting the number of times that $\Delta_i$, to be described later, has been positive. The variable i is used to indicate the number of operations and to designate data items which are to be processed.

Subsequently, the controller 14 reads the data item $D_1$ from the D-table 30 and the data item $d_1$ from the d-table 31 to calculate a difference $\Delta_1$ ($=D_1-d_1$) therebetween. The difference $\Delta_1$ as a result of the calculation is stored in the difference-table 32, at a step 202. Subsequently, the controller 14 determines whether or not the variable i has reached the number of times N at a step 204. If the variable i has not yet reached the number of times N, that is, if the data items for which the difference has not yet been calculated remains, the value of the variable i is incremented by one at a step 206, and subsequently the process returns to the step 202 to repeat a similar operation.

If the variable i has reached the number of times N at a step 204, that is, if the differences $\Delta_1$ to $\Delta_N$ for all the data items $d_1$ to $d_N$ and $D_1$ to $D_N$ have been obtained, the process proceeds to a step 208.

At the step 208, the controller 14 initializes the variable i anew (that is, sets i to "1"). At a step 210, the controller 14 determines whether or not the difference $\Delta_1$ is positive. If the difference $\Delta_1$ is positive, the process proceeds to a step 212, and the value of the variable C is incremented by one. Subsequently, the process proceeds to a step 214. Conversely, if the difference $\Delta_1$ is not positive, the process directly proceeds to a step 214.

At the step 214, the controller 14 ascertains whether or not the variable i has reached the number of times N, that is, whether or not the determination at the step 210 has been completed for all the differences $\Delta_1$ to $\Delta_N$. If the variable i has not reached the number of times N, that is, if a difference or differences for which the determination at the step 210 has not been completed remains, the variable i is incremented by one at a step 216 and the process returns to the step 210. A similar operation as mentioned above is then repeated until the variable i has reached the number of times N.

If the variable i has reached the number of times N at the step 214, the process proceeds to a step 218.

At the step 218, the controller 14 determines whether or not the variable C has reached the predetermined reference number of times L. If the variable C has reached the reference number of times L, the controller 14 determines that the slight lowering $-\Delta V$ in the battery voltage has been detected at a step 220. Conversely, if the variable C has not reached the reference number of times L, the controller 14 determines that the slight lowering $-\Delta V$ has not been detected at a step 222.

Subsequently to the above-mentioned operation, the process proceeds to the step 130 in FIG. 8.

The above-described cellular telephone 20 according to the sixth embodiment can accurately determine whether or not the battery 21 has reached the full charge state without being subject to the influence of errors which occur in the A/D conversion. In addition, the number of samplings is reduced, thus alleviating a load on the charger 10 which is required for the determination.

To give a specific example, when the present invention is applied to a cellular telephone as a portable information terminal of US-CDMA type, the number of steps which are executed for the program can be reduced as much as about 80% as compared with the use of the conventional art. Furthermore, since the full charge state can be accurately detected by the cellular telephone of US-CDMA type to which the present invention is applied, the charging rate can be increased to a level which is comparable to the charging rate obtained with a cellular telephone of US-TDMA type. The term "charging rate" used herein refers to the length of time during which a given device can be normally operated when the battery is determined to have been fully charged.

In the above description of the sixth embodiment, the sampling has been performed at a desired timing which is defined by the sampling interval $t_1$ or $t_2$ and the series interval $t_4$. However, the sampling may be executed at a desired timing which may be periodic or a periodic. However, in such instance, only those of sampled data items which are obtained at a given timing defined by the sampling interval $t_1$ or $t_2$ and the series interval $t_4$ are used in the determination.

In the above description of the sixth embodiment, data items in the d-series are sampled after the sampling of data items in the D-series has been completely finished. However, as mentioned previously in connection with the first embodiment, the sampling of the d-series may be started before the sampling of data items in the D-series has been completely finished. Further, the i-th data item in the d-series may be sampled at the same time as the (i+j)-th data item in the D-series, where j is a predetermined positive integer not more than N−1 . . . This can be easily implemented by partly modifying the control program used by the controller 14.

The actual calculation used is not limited to the one illustrated in the above-described embodiments. By way of example, the calculation to determine the difference may be performed by subtracting the data item $D_i$ in the D-series from the data item $d_i$ in the d-series. In addition, the number of times that the difference is less than 0 may be compared against a reference value, and the determination may be rendered depending on whether or not the number of times is less than the reference value. Furthermore, a ratio of the number of times that the difference is positive relative to the number of samplings (N) may be calculated, and the determination may be rendered depending on whether or not the ratio calculated is higher than the predetermined reference value without substantially changing the teaching of the method of the first embodiment. However, when such arrangement is employed, it is necessary to modify the calculation process used and the definition (the number of times and/or the ratio) of the reference value.

As described above, in accordance with the first to sixth embodiments, even if a fluctuation in the evaluation data (that is, a fluctuation in the battery voltage) occurs sporadically and suddenly due to, for example, the change in the power dissipation of the device, the fluctuation in the evaluation data does not influence the other evaluation data. In other words, the influence by the fluctuation in the evaluation data is exerted upon only one sampling data item. Accordingly, the remaining evaluation data does not influenced by the fluctuation in the evaluation data. Therefore, the determination whether or not the battery has reached the full charge state is little influenced by such fluctuation, thus allowing the determination to be. rendered with good accuracy and with a relatively few number of sampling times. Similarly, the present invention is effective to guard against a reading error of the A/D converter which occurs randomly. As a consequence, it is possible to determine whether the battery has reached a full charge state rapidly and accurately. Since whether or not the full charge state has been reached can be determined accurately with a reduced number of samplings of the battery voltage, a load on the device is alleviated.

The invention being thus described, it will be obvious that the same may be varied in many ways. Such variations are not to be regarded as a departure from the spirit and scope of the invention, and all such modifications as would be obvious to one skilled in the art are intended to be included within the scope of following claims.

What is claimed is:

1. A method for detecting a full charge state of a battery during a charging operation, comprising the steps of:
    obtaining a first data series including first to N-th data items, where N is a predetermined positive integer not less than 2, the first to N-th data items of the first data series corresponding to battery voltages measured at first sampling intervals during a first sampling time period, respectively;
    obtaining a second data series including first to N-th data items, the first to N-th data items of the second data series corresponding to battery voltages measured at second sampling intervals during a second sampling time period, respectively, a predetermined time delay being provided between a beginning of the first sampling time period and a beginning of the second sampling time period, the second sampling intervals being the same as the first sampling intervals;
    comparing an i-th data item of the first data series and an i-th data item of the second data series to obtain a number of times that the i-th data item of the second data series is smaller than the i-th data item of the first data series, where i=1, 2, . . . , N; and
    judging whether or not the battery has reached the full charge state on the basis of a ratio of the number of times to N.

2. A method of claim 1, wherein the first sampling intervals are even intervals, and the second sampling intervals are even intervals.

3. A method of claim 1, wherein the first sampling intervals are uneven intervals, and the second sampling intervals are uneven intervals.

4. A method of claim 1, wherein the second sampling time period begins after an end of the first sampling time period.

5. A method of claim 1, wherein the second sampling time period begins during the first sampling time period.

6. A method of claim 1, wherein, in said step of comparing, the i-th data item of the second data series is the (i+j)-th data item of the first data series, where j is a predetermined positive integer not more than N−1.

7. A device for detecting a full charge state of a battery during a charging operation, comprising:
    a measuring circuit for measuring a battery voltage; and
    a controller for controlling said measuring circuit;
    wherein said controller obtains a first data series including first to N-th data items, where N is a predetermined positive integer not less than 2, the first to N-th data items of the first data series corresponding to battery voltages measured by said measuring circuit at first sampling intervals during a first sampling time period, respectively;
    said controller obtains a second data series including first to N-th data items, the first to N-th data items of the second data series corresponding to battery voltages measured by said measuring circuit at second sampling intervals during a second sampling time period, respectively, a predetermined time delay being provided between a beginning of the first sampling time period and a beginning of the second sampling time period, the second sampling intervals being the same as the first sampling intervals; and
    said controller compares an i-th data item of the first data series and an i-th data item of the second data series to obtain a number of times that the i-th data item of the second data series is smaller than the i-th data item of the first data series, where i=1, 2, . . . , N, and judges whether or not the battery has reached the full charge state on the basis of a ratio of the number of times to N.

8. A device of claim 7, wherein the first sampling intervals are even intervals, and the second sampling intervals even intervals.

9. A device of claim 7, wherein the first sampling intervals are uneven intervals, and the second sampling intervals uneven intervals.

10. A device of claim 7, wherein the second sampling time period begins after an end of the first sampling time period.

11. A device of claim 7, wherein the second sampling time period begins during the first sampling time period.

12. A device of claim 7, wherein the i-th data item of the second data series is the (i+j)-th data item of the first data series, where j is a predetermined positive integer not more than N−1.

13. A cellular telephone comprising:
    a measuring circuit for measuring a battery voltage of a battery; and
    a controller for controlling said measuring circuit and a charging circuit of a charger for the cellular telephone;
    wherein said controller obtains a first data series including first to N-th data items, where N is a predetermined positive integer not less than 2, the first to N-th data items of the first data series corresponding to battery voltages measured by said measuring circuit at first sampling intervals during a first sampling time period, respectively;
    said controller obtains a second data series including first to N-th data items, the first to N-th data items of the second data series corresponding to battery voltages measured by said measuring circuit at second sampling intervals during a second sampling time period, respectively, a predetermined time delay being provided between a beginning of the first sampling time period and a beginning of the second sampling time period, the second sampling intervals being the same as the first sampling intervals;

said controller compares an i-th data item of the first data series and an i-th data item of the second data series to obtain a number of times that the i-th data item of the second data series is smaller than the i-th data item of the first data series, where i=1, 2, ..., N, and judges whether or not the battery has reached the full charge state on the basis of a ratio of the number of times to N; and said controller causes the charging circuit of the charger to stop charging when said controller judges that the battery has reached the full charge state.

14. A cellular telephone of claim 13, wherein the first sampling intervals are even intervals, and the second sampling intervals even intervals.

15. A cellular telephone of claim 13, wherein the first sampling intervals are uneven intervals, and the second sampling intervals uneven intervals.

16. A cellular telephone of claim 13, wherein the second sampling time period begins after an end of the first sampling time period.

17. A cellular telephone of claim 13, wherein the second sampling time period begins during the first sampling time period.

18. A cellular telephone of claim 13, wherein the i-th data item of the second data series is the (i+j)-th data item of the first data series, where j is a predetermined positive integer not more than N−1.

* * * * *